(12) United States Patent
Sherman

(10) Patent No.: US 6,611,174 B1
(45) Date of Patent: Aug. 26, 2003

(54) SELF-COMPENSATED TRANSIMPEDANCE AMPLIFIER

(76) Inventor: Adam J. Sherman, 5205 Durocher Ave., Apt. 19, Montreal Quebec (CA), H2V-3X9

( * ) Notice: Subject to any disclaimer, the term of this patent is extended or adjusted under 35 U.S.C. 154(b) by 0 days.

(21) Appl. No.: 10/142,784

(22) Filed: May 10, 2002

(51) Int. Cl.$^7$ ................................................. H03F 1/14
(52) U.S. Cl. .......................... 330/292; 330/294; 330/85
(58) Field of Search ........................... 330/85, 109, 110, 330/292, 294

(56) References Cited

U.S. PATENT DOCUMENTS

| | | | | |
|---|---|---|---|---|
| 4,156,853 A | * | 5/1979 | Peterson | ..................... 330/109 |
| 4,227,155 A | * | 10/1980 | Lerma | ......................... 330/11 |
| 5,982,232 A | | 11/1999 | Rogers | |
| 6,163,719 A | | 12/2000 | Sherman | |
| 6,297,695 B1 | * | 10/2001 | Schott | ......................... 330/110 |

OTHER PUBLICATIONS

Sigworth, F.J., Electronic Design of the Patch Clamp in Single–Channel Recording, edited by Sakmann and E. Neher, 1983, pp 3–35, Plenum Press, New York.

Designing Photodiode Amplifier Circuits with OPA 128, Burr Brown Application Bulletin 77, 1994, Burr–Brown Corporation, USA.

Sherman, A.J., Alvin Shrier and Ellis Cooper, Series Resistance Compensation for Whole–Cell Patch–Clamp Studies Using a Membrane State Estimator, *Biophys. J.*, Nov. 1999, vol. 77:2590–2601, Biophysical Society, USA.

* cited by examiner

Primary Examiner—Henry Choe

(57) ABSTRACT

A method to increase the bandwidth of a transimpedance amplifier using capacitive feedback. The resultant amplifier maintains wide bandwidth, high linearity, low noise, and low input impedance independent of component variations. These characteristics greatly facilitate the economical measurement of small currents such as those arising from photodiodes and biological preparations.

12 Claims, 2 Drawing Sheets

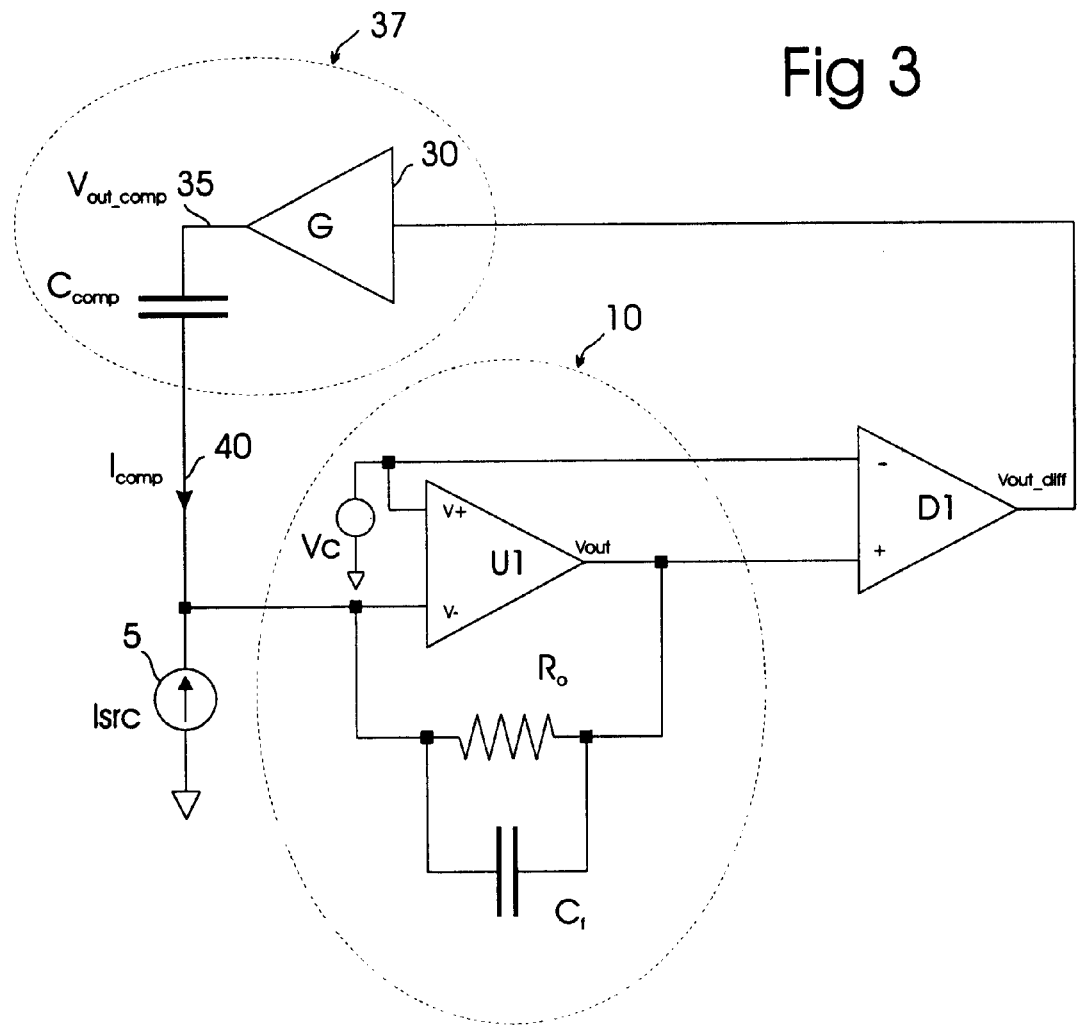

SELF-COMPENSATED TRANSIMPEDANCE AMPLIFIER

BACKGROUND OF INVENTION

1. Field of the Invention

This invention relates to the measurement of small currents using a transimpedance amplifier. The present invention teaches a method to create a transimpedance amplifier that has wide bandwidth and very high linearity.

2. Description of the Prior Art

The IV Converter

FIG. 1 shows a common transimpedance amplifier circuit used to measure small currents know as an IV converter. Referring to FIG. 1, an IV converter 10 consists of an operational amplifier U1, a feedback resistor $R_o$, and a feedback capacitance $C_f$ U1 has a non-inverting terminal V+, an inverting terminal V−, and an output terminal Vout. $R_o$ is connected between Vout and V− so that $R_o$ provides negative feedback around U1. $C_f$ is connected in parallels with $R_o$ and represents the sum of the stray capacitance across $R_o$ together with any additional feedback capacitance that parallels $R_o$. An input current Isrc 5 that is to be measured is connected to V−. Thus V− serves as the transimpedance input. V+ is connected to ground. Since U1 has a very large open loop gain, negative feedback forces V− to act as a low impedance virtual ground, and all of Isrc 5 flows across $R_o$. IV converter 10 produces an output voltage Vout given by:

$$V_{out} = -I_{src} R_o \quad (E1)$$

when $C_f$ is small enough to be ignored. Thus Vout serves as the transimpedance output. Therefore IV converter 10 measures an input current by producing an output voltage proportional to the input current. The constant of proportionality is called the transimpedance, and IV converter 10 the transimpedance is equal to the feedback resistance $R_o$.

An important property of IV converter 10 is the low input impedance it presents to Isrc 5. This low input impedance isolates Isrc 5 from voltage changes that would otherwise occur due to changing input current. An application requiring such a low input impedance is the linear measurement of photodiode current. Most photodiodes exhibit a nonlinear response with changes in bias voltage. The low input impedance of IV converter 10 ensures that the photodiode bias voltage remains constant, regardless of the value of photodiode current flowing. Another application requiring low input impedance is voltage clamping ionic currents in biological preparations. The low input impedance of IV converter 10 enables it to be conveniently used as biological voltage clamp (see *Electronic Design of the Patch Clamp* by F. J. Sigworth, 1983, found in *Single-Channel Recording*, edited by B. Sakmann and E. Neher, 1983). When used as a biological voltage clamp, V+ of U1 is driven by a command voltage instead of being grounded as in FIG. 1, and Isrc 5 is commonly a single cell under patch clamp conditions. The low input impedance of IV converter 10 ensures the cell is voltage clamped at the command voltage.

Signal-to-noise Ratio and Bandwidth of the IV Converter

As with any amplifier, IV converter 10 has an inherent signal-to-noise ratio (SNR) that limits the minimum size input signal that can be detected; to measure small currents it is necessary to maximize the SNR. The dominant noise source that degrades the SNR of IV converter 10 is the thermal Johnson noise of the feedback resistor $R_o$. The root-mean-square SNR for a given input signal Isrc in the presence of the thermal noise of $R_o$ is given by $$SNR_{rms} = I_{src} c_1 \frac{R_o}{\sqrt{R_o}} \quad (E2)$$

where c1 is a function of the measurement bandwidth and temperature.

As can be seen from Eq. E2, larger values of $R_o$ improve the SNR since the numerator of Eq. E2 grows faster than the denominator as $R_o$ is increased. When IV converter 10 is used to measure small currents such as those produced by a photodiode or a biological preparation, large values of $R_o$ must be used to ensure adequate SNR; typical values of $R_o$ range from tens of Megaohms to GigaOhms. When such high $R_o$ values are used, the effects of $C_f$ can no longer be ignored. These effects are quantified by the transfer function of Isrc 5 to Vout, given by $$\frac{V_{out}}{I_{src}} = \frac{-R_o}{R_o C_f s + 1} \quad (E3)$$

where s is the Laplace transform frequency variable. As shown in Eq. E3, $C_f$ in parallel with $R_o$ combine to create a pole with time constant $\tau_{uncomp} = R_o C_f$ which rolls off the frequency response. When $R_o$ is large, $\tau_{uncomp}$ becomes large enough to degrade the measurement bandwidth. While $\tau_{uncomp}$ can be decreased by physically lowering $C_f$, stability requirements preclude lowering $C_f$ much below 5 pF. To ensure stability of IV converter 10, it is generally necessary that $C_f$ be on the order of the input capacitance at the inverting terminal V− to avoid gain peaking (see Designing Photodiode Amplifier Circuits with OPA 128, Burr Brown Application Bulletin, 2000) Therefore, IV converter 10 usually has a signal bandwidth limit of ~1kH or less when measuring small currents, which is undesirable.

Prior Art Techniques to Increase Bandwidth

In order to increase the bandwidth of IV converter 10, it is common practice to use a post-amplification equalizer, as shown in FIG. 1. Referring to FIG. 1, a post-amplification equalizer 20 takes as input Vout and produces an output voltage Vout_equ 25. Equalizer 20 serves to cancel the pole in equation E3 by introducing a real left-hand plane zero with time constant $\tau_{zero} = \tau_{uncomp}$. In this way, equalizer 20 increases the output bandwidth of IV converter 10.

While equalizer 20 does increase bandwidth, it has several practical limitations stemming from the need to achieve and then to maintain accurate pole-zero cancellation. To achieve cancellation, equalizer 20 must be manually tuned for each IV converter produced because $\tau_{uncomp}$ varies with the parameter spread of $R_o$ and $C_f$. This tuning adds significant expense to large volume productions. More significantly, maintaining accurate cancellation is difficult since $\tau_{uncomp}$ and $\tau_{zero}$ drift unequally with changes in ambient temperature and humidity. The result of incomplete cancellation is the introduction of nonlinearities in the frequency response of IV converter 10 within the signal measurement bandwidth. Even with stable components, the accuracy of cancellation is degraded at higher frequencies owing to the well-know difficulties in making broadband analog equalizers.

A linear frequency response of IV converter 10 is especially important when voltage clamping ionic currents from single cell preparations using the whole-cell patch clamp technique. Under these conditions Vout is used as positive feedback to compensate for the high impedance of the measuring electrode using a technique called series resistance compensation (see *Sigworth* pages 28 to 32). As outlined by Sigworth, nonlinearities in the frequency response of IV converter 10 destabilizes series resistance compensation. Linear frequency response is also required when implementing series resistance compensation using a membrane state estimator, as taught by Sherman in U.S. Pat. No. 6,163,719 (2000). (See also Sherman et. al. 1999. Series Resistance Compensation for Whole-Cell Patch-Clamp Studies Using a Membrane State Estimator, *Biophys. J.* 77:2590–2601.). Consequently, it is extremely difficult to implement wideband series resistance compensation when using an IV converter equipped with a post-amplification equalizer.

High Input Impedance Transimpedance Amplifiers

In order to increase bandwidth, other transimpedance amplifier architectures are used which, unlike the IV converter, present a relatively high input impedance to the input current source. Rodgers (U.S. Pat. No. 5,982,232 (1999)) teaches a technique wherein the bandwidth of a high input impedance transimpedance amplifier is increased by using positive capacitive feedback to reduce the effects of input capacitance loading. While high bandwidths can be achieved using this technique, the high input impedance precludes its use in the many applications that require a low input impedance.

In summary, while the IV converter is a low noise, low input impedance transimpedance amplifier well-suited to the measurement of small currents, its low measurement bandwidth is a significant drawback. The practice of using an equalizer to improve the measurement bandwidth has the following disadvantages:

a. The equalizer must be manually tuned, increasing production cost.
b. Parameter variations with temperature and humidity make it difficult for the equalizer to maintain accurate pole-zero cancellation, thus compromising performance.
c. It is difficult for the equalizer to maintain accurate pole-zero cancellation over broad frequencies, thus introducing nonlinearities in the measurement bandwidth.

OBJECTS AND ADVANTAGES

Accordingly, several objects and advantages of the present invention are:

a. to provide a wide bandwidth transimpedance amplifier that does not require manual tuning;
b. to provide a wide bandwidth transimpedance amplifier that is independent of parameter changes; and
c. to provide a wide bandwidth transimpedance amplifier with high linearity.

Further objects and advantages of the present invention will become apparent from a consideration of the ensuing description and drawings.

DRAWING FIGURES

FIG. 3 shows an IV converter configured as a voltage clamp with capacitive feedback, in accordance with the present invention.

SUMMARY OF INVENTION

In accordance with the invention, a method is provided to apply capacitive feedback to a low input impedance transimpedance amplifier with an undesired roll-off in its frequency. response, thereby shifting the roll-off to a higher frequency so as to increase the resultant transimpedance bandwidth. This creates a self-compensated transimpedance (SCTI) amplifier.

DESCRIPTION OF PREFERRED EMBODIMENTS

Figure 1:
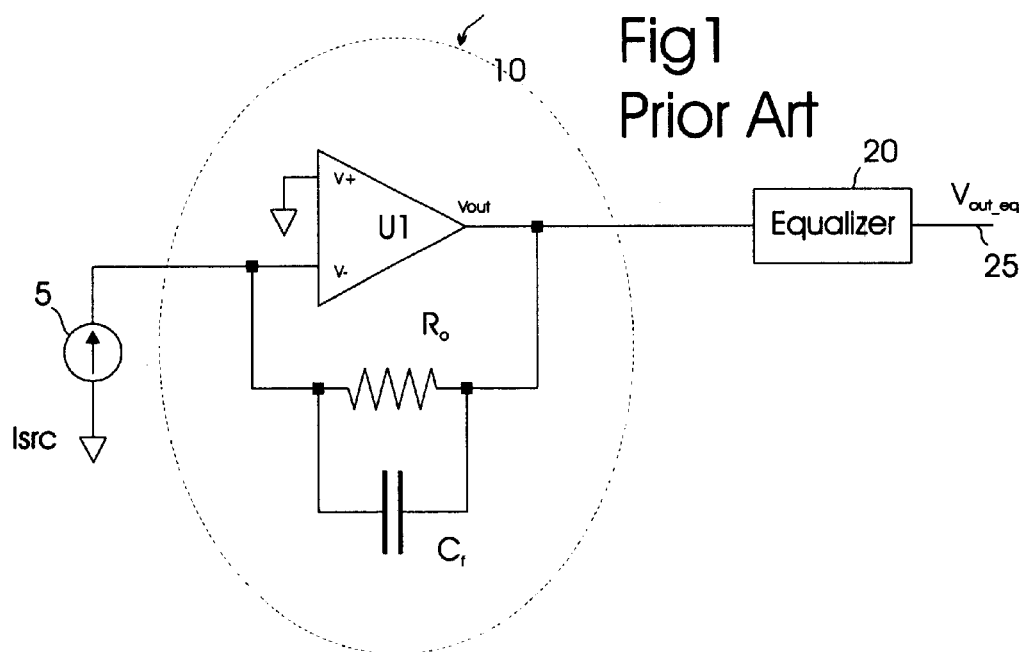
FIG. 1 shows an IV converter with a post-amplification equalizer (Prior Art).
Figure 2:
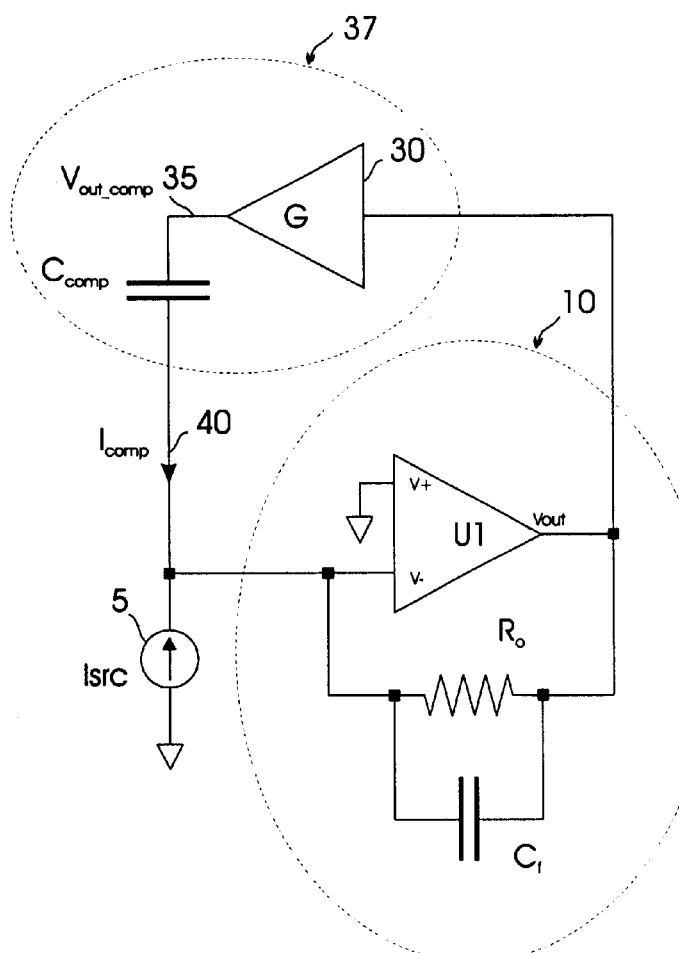
FIG. 2 shows an IV converter with capacitive feedback, in accordance with the present invention.

A typical embodiment of the SCTI amplifier of the present invention is applied to the IV converter is shown in FIG. 2. Referring to FIG. 2, IV converter 10 is shown with the addition a capacitive feedback means 37, in accordance with the present invention. Capacitive feedback means 37 takes as input Vout and produces a compensation current Icomp 40. Icomp 40 acts as an additional input to IV converter 10. An embodiment of capacitive feedback means 37 is shown in FIG. 2, where capacitive feedback means 37 comprises a voltage scaler 30 and a compensation capacitor Ccomp. Voltage scaler 30 is a prior art circuit well known to those skilled in the art that scales an input voltage by a positive or negative constant, providing this scaled input voltage as an output voltage. Scaler 30 takes as input Vout and produces an output voltage Vout_comp 35 by multiplying Vout by the scale factor G. Ccomp is connected between Vout_comp 35 and V−, thus providing Icomp 40 to IV converter 10. Therefore capacitive feedback means 37 provides a feedback of either positive or negative polarity to the transimpedance amplifier.

$$\frac{V_{out}}{I_{src}} = \frac{-R_o}{R_o(C_f + GC_{comp})s + 1} \quad (E4)$$

The effect Icomp 40 can be understood by examining the IV converter transfer function of FIG. 2, which is given by $$\frac{V_{out}}{I_{src}} = \frac{-R_o}{R_o(C_f + GC_{comp})s + 1} \quad (E4)$$

Comparing Eq. E4 to Eq. E3 (the IV converter transfer function without comp 40) shows that the two equations have the same form, but that Icomp 40 serves to either increase or decrease the effective value of $C_f$ in equation E4. If G is negative, Icomp 40 provides positive feedback to IV converter 10, and the effective value of $C_f$ is decreased; this increases the transimpedance bandwidth. Conversely, if G is positive, Icomp 40 provides negative feedback, and the elective value of $C_f$ is increased; this decreases the transimpedance bandwidth.

A further embodiment of the present invention is shown in FIG. 3, where IV converter 10 is shown with the addition of a command voltage Vc and a differential amplifier D1 so as to create a voltage clamp. Referring to FIG. 3, voltage Vc is connected to the V+ input of U1. This forms a voltage clamp since the large open loop gain of U1 forces Isrc 5 to be clamped at voltage Vc. A differential amplifier D1 subtracts Vc from Vout to produce an output voltage Vout_ diff. Vout_diff then serves as the input to capacitive feedback means 37, which then operates in a manner analogous to that described for FIG. 2.

OPERATION OF INVENTION

The SCTI amplifier increases the bandwidth of an otherwise low bandwidth transimpedance amplifier by using positive feedback; selecting the amount of positive feedback determines the final output bandwidth obtained. In practice this reduces to selecting a value for the scaling constant G.

Selecting a Value for G

Referring to FIG. 2, the uncompensated bandwidth is set by the time constant $\tau_{uncomp}=R_oC_f$ where the values of $R_o$ and $C_f$ are constrained by the application. Specifically, $R_o$ must be large enough for adequate SNR but not so large so as to overly restrict the dynamic range, and $C_f$ must be large enough to ensure stability.

To select a value for G, a time constant $\tau_{uncomp}$ is chosen that corresponds to the desired output bandwidth. G is computed directly as $$G = \frac{\tau_{uncomp} - \tau_{comp}}{R_o C_{comp}} \tag{E5}$$

Output Bandwidth Limit

While equation E4 predicts, to first order, a critically damped response regardless of output bandwidth, in practice higher order effects will ultimately limit the maximum bandwidth attainable above which undamped oscillations arise. These higher order effects arise due the limited gain-bandwidth product of U1, and can be ignored if the compensated bandwidth is kept less than roughly one tenth the gain-bandwidth product of U1.

Operational Implications

The SCTI amplifier overcomes the limitations of the prior art by eliminating the post-amplification equalizer. Some of the improvements that immediately follow are:

a. Linear frequency response The SCTI amplifier is not adversely affected by parameter changes in the uncompensated transimpedance. As can be seen from Eq. 4, shifts in either $R_o$ and/or $C_f$ simply shift the final value of $\tau_{uncomp}$. Unlike the prior art, there are no nonlinearities introduced in the passband due to incomplete pole-zero cancellation. At frequencies below $\tau_{uncomp}$ the SCTI amplifier exhibits very high linearity. At frequencies above $\tau_{uncomp}$ the SCTI amplifier exhibits a single pole roll-off, unlike the multi-pole response that arise with an untuned equalizer.

b. Ease-of-production Since the SCTI amplifier response is not dependent on absolute parameter values, average component values can be used to calculate the output bandwidth using Eq. 5. This eliminates the tedious and costly procedure of tuning each unit, as is necessary with the prior art.

c. Wide bandwidth By selecting an appropriate value for Ccomp, the value of G can be kept near unity, maximizing the bandwidth of scaler 30 when scaler 30 is constructed using operational amplifiers with a finite gain-bandwidth product. In contrast with the prior art, an equalizer constructed using operational amplifiers operate at gains greater than unity, thus limiting the compensated output bandwidth.

CONCLUSIONS, RAMIFICATIONS, AND SCOPE

Accordingly, the reader will see that the SCTI amplifier provides a practical, easy-to-implement, and cost-effective method to increase the bandwidth of transimpedance amplifiers that provides low noise, wide bandwidth, and very high linearity.

Although the description above contains many specificities, these should not be construed as limiting the scope of the invention but as merely providing illustrations of some presently preferred embodiments of this invention. Many other embodiments of the SCTI amplifier are immediately apparent to one skilled in the art. For example, instead of generating Icomp 40 using scaler 30 and Ccomp, Icomp 40 could be generated digitally using a suitably fast digital signal processor equipped with digital-to-analog and analog-to-digital conversion hardware. In addition, the SCTI amplifier of the present invention is not constrained for use solely with the IV converter architecture as illustrated in the preferred embodiment. The SCTI amplifier of the present invention will work equally well with any transimpedance amplifier architecture that presents a low input impedance to the input current source. Thus the scope of the invention should be determined by the appended claims and their legal equivalents, rather then by the examples given.

I claim:

1. A machine for increasing or decreasing the bandwidth of a transimpedance amplifier comprising:
   a) a transimpedance amplifier having a transimpedance bandwidth, a transimpedance input, and a transimpedance output, said transimpedance input having a low input impedance, and
   b) a capacitive feedback means which takes as input said transimpedance output and generates a compensation current which supplies a feedback of either positive or negative polarity to said transimpedance amplifier at said transimpedance input,
   wherein said transimpedance bandwidth of said transimpedance amplifier is increased when said feedback is positive and decreased when said feedback is negative.

2. The machine of claim 1, wherein said capacitive feedback means comprises:
   1. a voltage scaler to scale said transimpedance output by a constant value producing a scaled output, and
   2. a compensation capacitor connected between said scaled output and said transimpedance input.

3. The machine of claim 1, wherein said transimpedance amplifier comprises an IV converter with an inverting terminal, a noninverting terminal, an output terminal, and a high open loop gain.

4. The machine of claim 2, wherein said transimpedance amplifier comprises an IV converter with an inverting terminal, a non-inverting terminal, an output terminal and a high open loop gain.

5. The machine of claim 3, said IV converter further including:
   i) a command voltage connected to said non-inverting terminal, and
   ii) a differential amplifier to subtract said command voltage from the voltage on said output terminal, forming a differential output voltage which serves as said transimpedance output,
   wherein said high open loop gain forces said inverting terminal to be clamped to said command voltage to form a voltage clamp.

6. The machine of claim 4, further including:

1) a command voltage connected to said non-inverting terminal, and 2) differential amplifier to subtract said command voltage from the voltage on said output terminal, forming a differential output voltage which serves as said transimpedance output, wherein said high open loop gain forces said inverting terminal to be clamped to said command voltage to form a voltage clamp.

7. A method for increasing or decreasing the bandwidth of a transimpedance amplifier comprising:

a) providing a transimpedance amplifier having a transimpedance bandwith a transimpedance input, and a transimpedance output, said transimpedance input having a low input impedance, and b) providing a capacitive feedback means which takes as input said transimpedance output and generates a compensation current which supplies a feedback of either positive or negative polarity to said transimpedance amplifier at said transimpedance input, wherein said transimpedance bandwidth of said transimpedance amplifier is increased when said feedback is positive and decreased when said feedback is negative.

8. The method of claim 7, wherein said capacitive feedback means comprises:

1. a voltage scaler to scale said transimpedance output by a constant value, producing a scaled output, and 2. a compensation capacitor connected between said scaled output and said transimpedance input.

9. The method of claim 7, wherein said transimpedance amplifier comprises an IV converter with an inverting terminal, a non-inverting terminal, an output terminal, and a high open loop gain.

10. The method of claim 8, wherein said transimpedance amplifier comprises an IV converter with an inverting terminal, a non-inverting terminal, an output terminal, and a high open loop gain.

11. The method of claim 9, said IV converter further including:

i) a command voltage connected to said non-inverting terminal, and ii) a differential amplifier to subtract said command voltage from the voltage on said output terminal, forming a differential output voltage which serves as said transimpedance output, wherein said high open loop gain forces said inverting terminal to be clamped to said command voltage to form a voltage clamp.

12. The method of claim 10 further including 1) a command voltage connected to said non-inverting terminal, and 2) a differential amplifier to subtract said command voltage from the voltage on said output terminal, forming a differential output voltage which serves as said transimpedance output, wherein said high open loop gain forces said inverting terminal to be clamped to said command voltage to form a voltage clamp.

* * * * *